(12) United States Patent
Filippi et al.

(10) Patent No.: US 6,989,282 B2
(45) Date of Patent: Jan. 24, 2006

(54) CONTROL OF LINER THICKNESS FOR IMPROVING THERMAL CYCLE RELIABILITY

(75) Inventors: Ronald Gene Filippi, Wappingers Falls, NY (US); Lynne Marie Gignac, Beacon, NY (US); Vincent J. McGahay, Poughkeepsie, NY (US); Conal Eugene Murray, Yorktown Heights, NY (US); Hazara Singh Rathore, Stormville, NY (US); Thomas M. Shaw, Peekskill, NY (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 10/815,418

(22) Filed: Apr. 1, 2004

(65) Prior Publication Data

US 2005/0227380 A1    Oct. 13, 2005

(51) Int. Cl.
*H01L 21/66*         (2006.01)
(52) U.S. Cl. .................. 438/14; 438/637; 438/638; 438/672; 438/673; 438/700
(58) Field of Classification Search .............. None
See application file for complete search history.

(56) References Cited

U.S. PATENT DOCUMENTS

2005/0186689 A1 * 8/2005 Filippi et al. ................. 438/14

OTHER PUBLICATIONS

U.S. Appl. No. 10/726,140, Hichri et al.
Hance H. Huston and C. Patrick Clarke; "Reliability Defect Detection and Screening during Processing—Theory and Implementation"; IEEE/IRPS; Jan. 1992; pp. 268-275.
R. G. Filippi et al.; "Thermal Cycle Reliability of Stacked Via Structures with Copper Metallization of an Organic Low-K Dielectric"; sent in Oct. 2003 to International Reliability Physics Symposium committee for later publishing; 4 pages (including 2004 IRPS Submission Cover Page and article).
R. G. Filippi et al.; "Thermal Cycle Reliability of Stacked Via Structures with Copper Metallization and an Organic Low-K Dielectric"; IBM Hopewell Junction, NY Yorktown Heights, NY, Essex Junction, VT; Feb. 20, 2004; 7 pages.

* cited by examiner

*Primary Examiner*—Dung A. Le
(74) *Attorney, Agent, or Firm*—Keusey, Tutunjian & Bitetto, P.C.; Robert M. Trepp, Esq.

(57) ABSTRACT

A device, system and method for evaluating reliability of a semiconductor chip are disclosed. Strain is determined at a location of interest in a structure. Failures are evaluated in a plurality of the structures after stress cycling to determine a strain threshold with respect to a feature characteristic. Structures on a chip or chips are evaluated based on the feature characteristic to predict reliability based on the strain threshold and the feature characteristic. Predictions and design changes may be made based on the results.

13 Claims, 7 Drawing Sheets

CONTROL OF LINER THICKNESS FOR IMPROVING THERMAL CYCLE RELIABILITY

BACKGROUND OF THE INVENTION

1. Field of the Invention

The present invention relates to semiconductor processing, and more particularly to a system and method for employing feature characteristics, such as, liner thickness as an indicator of thermal stress during temperature cycles in metal structures.

2. Description of the Related Art

Reliability under thermal cycle conditions is one of the main concerns when integrating Back End of Line (BEOL) structures with low dielectric constant dielectrics. The cause of thermal cycle fails is typically the mismatch in the coefficients of thermal expansion (CTE) between the metallization and the surrounding insulator. For example, the CTE of copper (Cu) is approximately 16 ppm/° C. while that of SiLK™ (trademark of Dow Chemical) is approximately 60 ppm/° C. As a result, the Cu metallization is strained during thermal cycle testing, which can lead to crack formation in Cu vias and eventual failure. While the thermal cycle performance of a given process can be evaluated by stressing specifically designed test structures, such as stacked via chains, this can only be done on a limited sampling of parts and only on complete builds of the structure.

It would be highly desirable to have a method and apparatus for determining the thermal cycle performance provided by a manufacturing process before completing manufacturing of the device.

SUMMARY OF THE INVENTION

A system, apparatus and method for evaluating reliability of a semiconductor chip are disclosed. Strain is determined at a location of interest in a structure. Failures are evaluated in a plurality of the structures after stress cycling to determine a strain threshold with respect to a feature characteristic. Structures on a chip or chips are evaluated based on the feature characteristic to predict reliability based on the strain threshold and the feature characteristic. Predictions and design changes may be made based on the results.

A semiconductor device includes a metallization structure having a metal patterned with conductive liners along bottoms and sidewalls of vias of the structure. A dielectric material surrounds the metal, wherein a mismatch in coefficient of thermal expansion (CTE) exists between the metallization and surrounding insulator. The conductive liners are configured and dimensioned to provide a liner thickness that makes the metallization structure less susceptible to thermal cycle failure such that no failures are expected during thermal cycle stress conditions, e.g., during −65° C. to +150° C. cycles.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

The present invention relates to determining reliability of a semiconductor device. In particularly useful embodiments, the present invention employs physical attributes of a chip to indicate the reliability of a device. In one embodiment, liner thickness of interconnects (between layers in a chip structure), for example, Dual Damascene interconnects, is employed as a parameter that directly correlates with the thermal cycle reliability of via stacks during thermal cycling. A Dual Damascene process is commonly employed for fabricating metal interconnects.

The liner thickness of, e.g., Dual Damascene interconnects may be used as a measure of the thermal cycle performance. This can be used to control the thermal cycle behavior of back end of line (BEOL) structures. Measurement of, for example, liner thickness provides a sensitive way to determine when process conditions fall outside a desirable window, where the process window assures thermal cycle reliability during the manufacture of BEOL structures.

Figure 1:
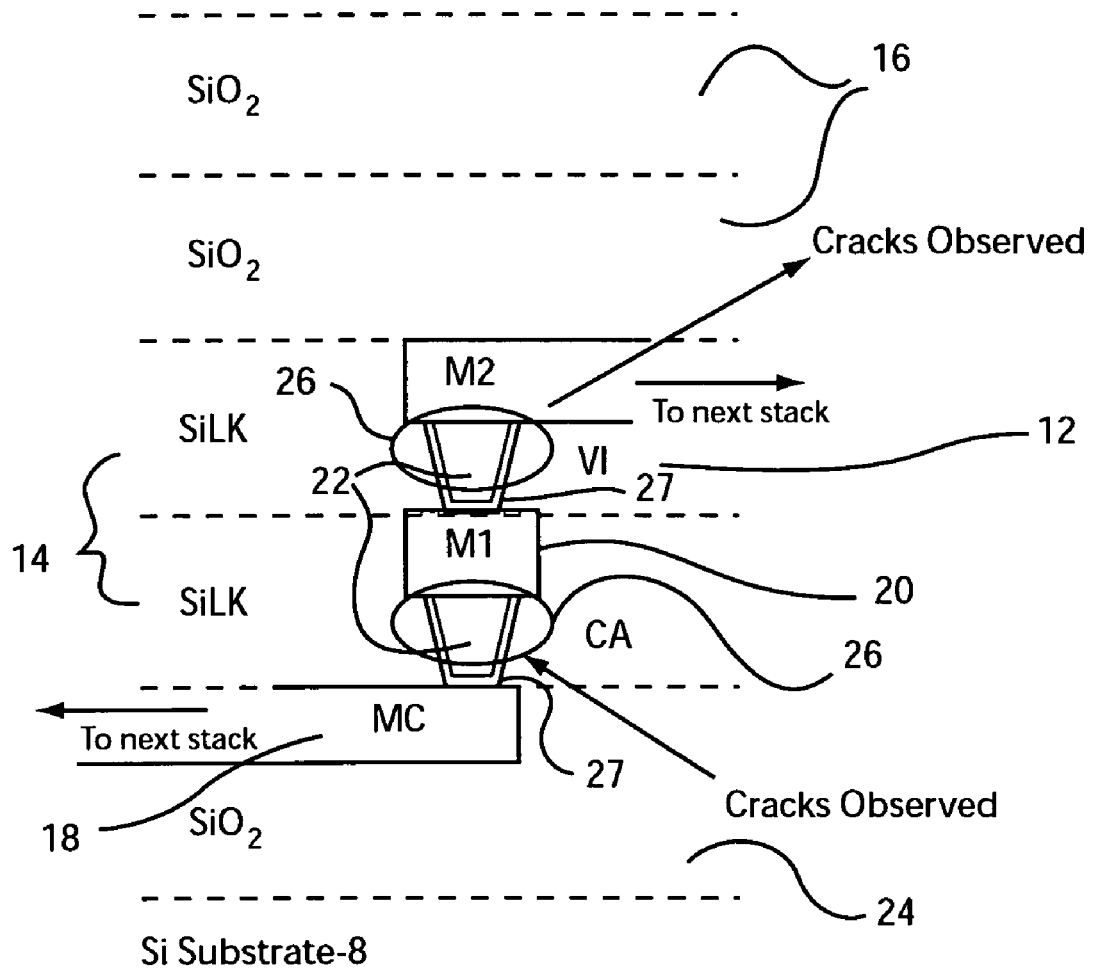
FIG. 1 is a schematic cross-sectional view of a test structure in accordance with one embodiment of the present invention.

Referring now in detail to the figures in which like numerals represent the same or similar elements and initially to FIG. 1, a schematic cross section of a structure 10 used for thermal cycle study in accordance with one embodiment of the present invention is shown. The test structure 10 (also referred to as a "stacked via chain") is employed to verify the stability of, e.g., SiLK™/Cu BEOL structures during thermal cycling. It should be noted that other metals and dielectric materials may be employed in addition to or instead of the SiLK™/Cu materials illustratively described herein. For example dielectrics such as SiCOH, nitrides, silicon dioxide or other organic or inorganic dielectrics may be employed. In addition, metals such as aluminum (Al), copper (Cu), Gold (Au), silver (Ag), and alloys or combinations thereof may also be employed.

The structure 10 includes a stacked via chain 12, where two SiLK™ levels 14 (e.g., levels M2/V1, and M1/CA) are followed by two silicon dioxide (SiO$_2$) levels 16. The chain 12 may include, e.g., 50 links, alternating between layer MC, which may include a tungsten (W) local interconnect 18, and M2. Other numbers of links and configurations are also contemplated.

Structure 10 preferably includes a dual damascene structure to provide stress risers at the interface between vias 22 (CA and V1) and adjacent metal. Other structures that can fail due to thermal induced strain may also be employed.

M1 may include a square plate 20. In one example, plate 20 measures about 0.35 μm on a side while CA and V1 measure about 0.22 μm in diameter.

Thermal cycle failure is a result of metal fatigue, a phenomenon described by crack formation and growth due to cyclic strain. During thermal cycle testing, layers 14 (e.g., SiLK™) expand and contract significantly, generating large stresses in vias 22 (e.g., CA and V1). The resulting via strain is enhanced by the mechanical confinement of the rigid SiO$_2$ layers above (16) and below (24) the metallization. Layers 24, in this case, are formed on a substrate 8, which may include, for example, a silicon or silicon-on-insulator material. Eventually, cracks may be initiated in regions 26 and propagate across the vias 22 (e.g., formed from Cu), causing a resistance increase if the cracks reach a critical size. An electrical open occurs if the cracks compromise liner integrity for liners 27 formed on sides and bottoms of vias 22.

In one embodiment, the structure 10 includes aluminum (Al), copper (Cu), Gold (Au), silver (Ag), or alloys thereof as metal and, the dielectric may include an organic material, such as SiLK™ or polyimide. A liner material 27 may include tantalum (Ta), tantalum nitride (TaN), titanium (Ti), titanium nitride (TiN) or tungsten (W). The liner material is deposited prior to filling via holes with metal. The mismatch in CTE between the metal and insulator is preferably greater than about 30 ppm/° C.

Test structure 10 may be employed to verify the stability of SiLK™/Cu BEOL structures during thermal cycling.

Figure 2:
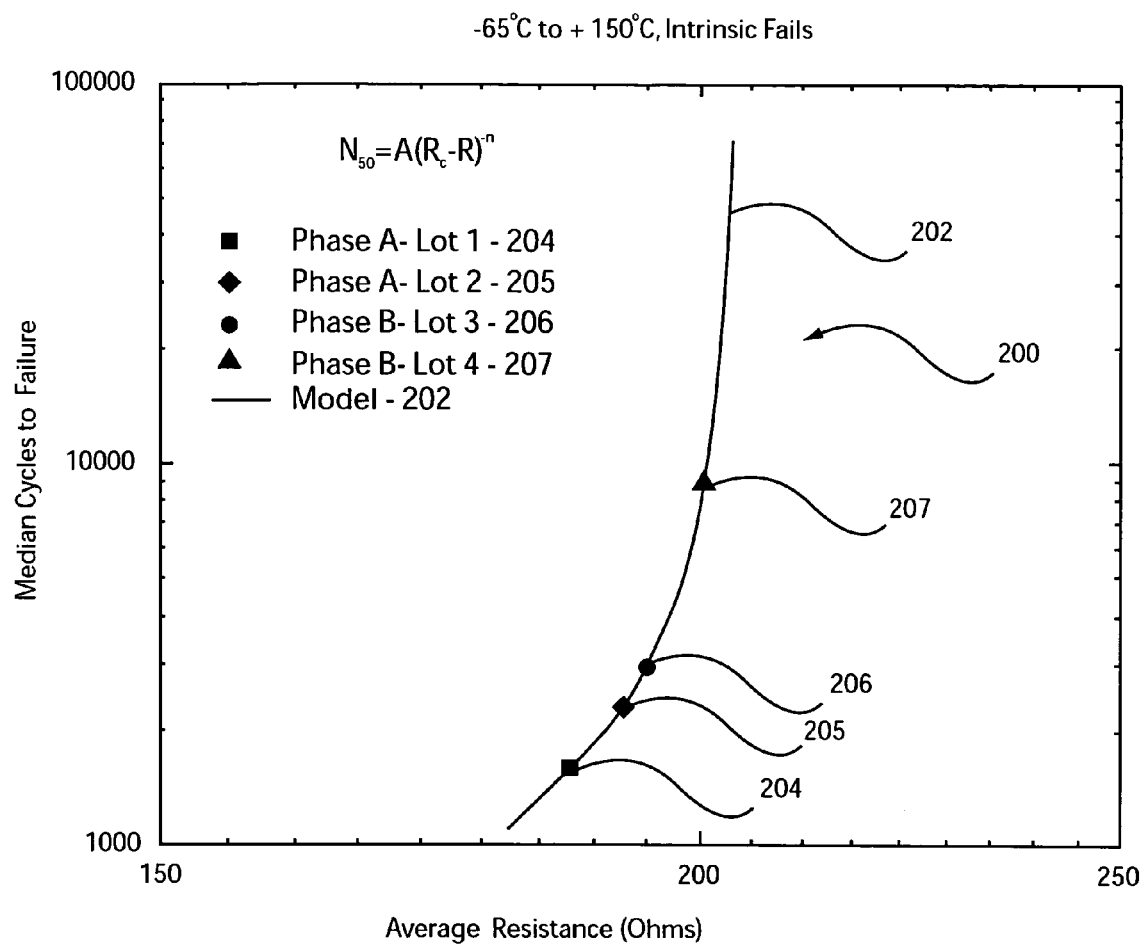
FIG. 2 is a log-log plot of $N_{50}$ versus average resistance on a test device for different lots tested after thermal cycle testing in accordance with one embodiment of the present invention.

Referring to FIG. 2, two different processes, Phase A and Phase B are compared such that there is a one to one correspondence between the resistance of the structure (as built) and the failure rate of the structure during thermal cycle testing. FIG. 2 is a log-log plot of $N_{50}$ (the number of cycles to 50% failure) versus Average Resistance for structure 10 for different lots of devices (lots 1–4, indicated respectively by find numerals 204–207 in FIG. 2), which were thermal cycled from −65° C. to +150° C. The data is fit to an empirical relation, $N_{50} = A(R_c − R)^{−n}$, where $R_c$ is a critical resistance above which thermal cycle fails should not occur. A and n are coefficients determined to provide the best fit for plot 200.

Plot 200 shows strong agreement between a mathematical model 202, given by the solid line, and actual data indicated by the shapes indicative of lots 1–4 (204–207). One concept behind the model is that a higher resistance for structure 10 corresponds to a thicker liner 27 (FIG. 1). This is due to the liner materials, which may include tantalum (Ta) and/or tantalum nitride (TaN) that have much higher resistivities compared to, say, Cu metallization. The liner 27 may be thought of as sharing the stress in the stacked via structure (e.g., vias 22 in FIG. 1) with the Cu. The liner materials may have a higher bulk modulus and a higher yield stress than Cu or other metals. Therefore, a thicker liner 27 corresponds to greater structural support in the stacked via structure 12.

Although there may be other factors that affect the resistance (grain size, via dimensions), the liner thickness is the most likely source of differences in resistance, particularly since process differences, e.g., phase B hardware may have a thicker liner than the phase A hardware, are known. FIG. 2 shows a large difference in $N_{50}$ for the two phase B lots (lots 3 and 4) over phase A lots (lots 1 and 2), which were processed at around the same time.

To verify that the thermal cycle performance correlates with liner thickness, samples from two of the lots shown in FIG. 2 were submitted for transmission electron microscope (TEM) analysis. The first lot is indicated by reference number 204, and the second lot is indicated by reference number 206. The TEM cross sections of structure 10 from lots 204 and 206 measured approximate liner thicknesses at various points in the stacked via structures. The Phase B liner (lot 206) was clearly thicker than the Phase A liner (lot 204). Based on the measurements of the liner thicknesses, the average liner thickness for lot 204 was 19.42 nm while the average liner thickness for lot 206 was 25.08 nm. This information is employed below.

Figure 3:
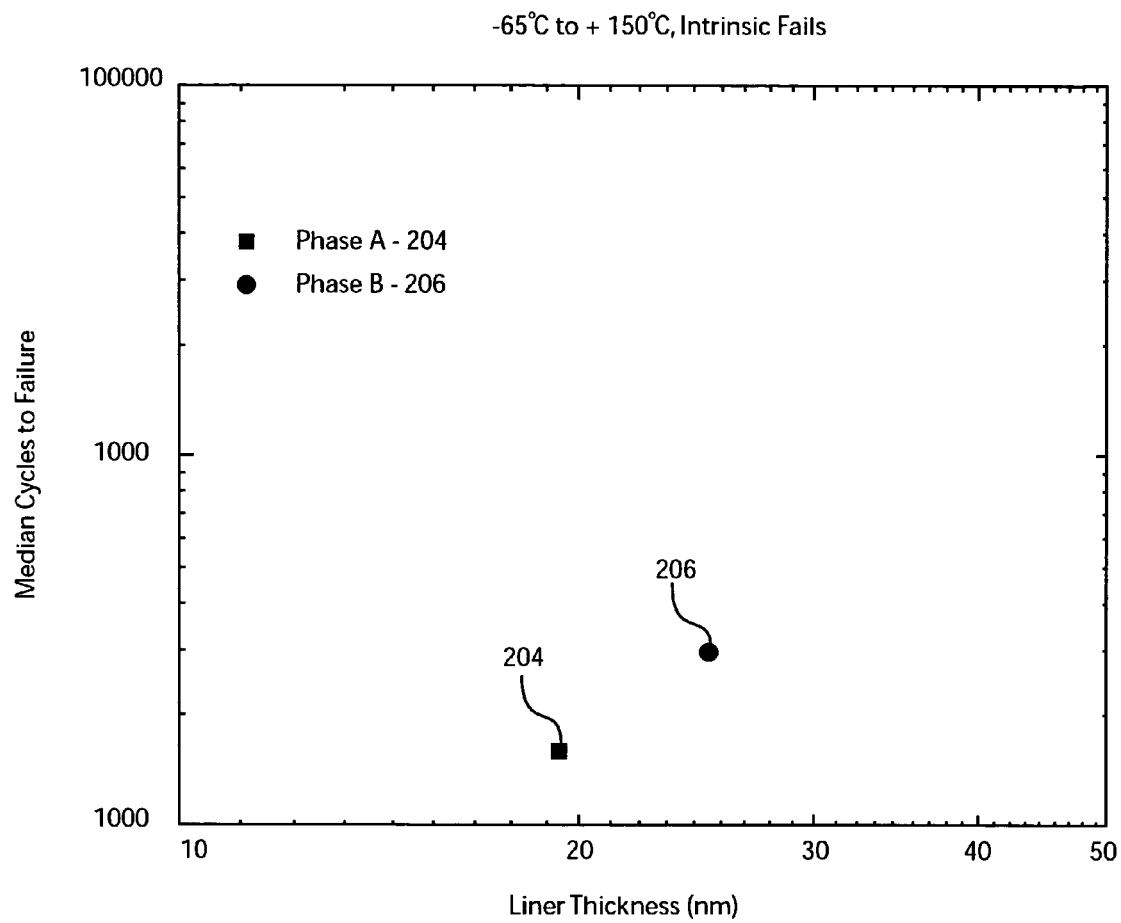
FIG. 3 is a log-log plot of $N_{50}$ versus liner thickness for the phase A and phase B liner processes in accordance with the present invention.

Referring to FIG. 3, a log-log plot of $N_{50}$ versus Liner Thickness for lots 204 and 206, clearly shows that a thicker liner with the Phase B process results in a higher thermal cycle lifetime.

Referring again to FIG. 1, a link or correlation between liner thickness and thermal cycle reliability behavior involves the strain that is applied to the stacked via chain 12 during thermal cycling. The effects of liner thickness are most pronounced at via bottoms in the stacked via structure 10, where the cross-sectional area of the metal (e.g., Cu) is lowest. At this location, the liner 27 acts to carry a larger portion of the force that develops in the stacked via due to the thermal strain.

An evaluation of the elastic strain in the metal (Cu, etc.) can be performed by modeling the mechanical response of the stacked via 12. Expansion of the SiLK™ or other dielectric during an increase in temperature represents the driving force in which the stacked via is stretched between the substrate 8 and the top passivation levels (e.g., layer 16, etc.). The top passivation levels can be modeled as elastic plates on an elastic foundation with pinning forces applied by the stacked via structures 12. The resulting forces on each of the stacked vias 12 are calculated. The strain modeling of stacked via structures may be provided as described in U.S. patent application Ser. No. 10/726,140, entitled "Building Metal Pillars in a Chip Structure Support", filed Dec. 2, 2003, which is commonly assigned and incorporated herein by reference.

Because the pinning force is transmitted through all levels of the stacked via 12, the section with the smallest cross-sectional area will possess the highest value of strain. The results of the strain in the metal (Cu) at the via bottom are illustrated in FIG. 4.

Figure 4:
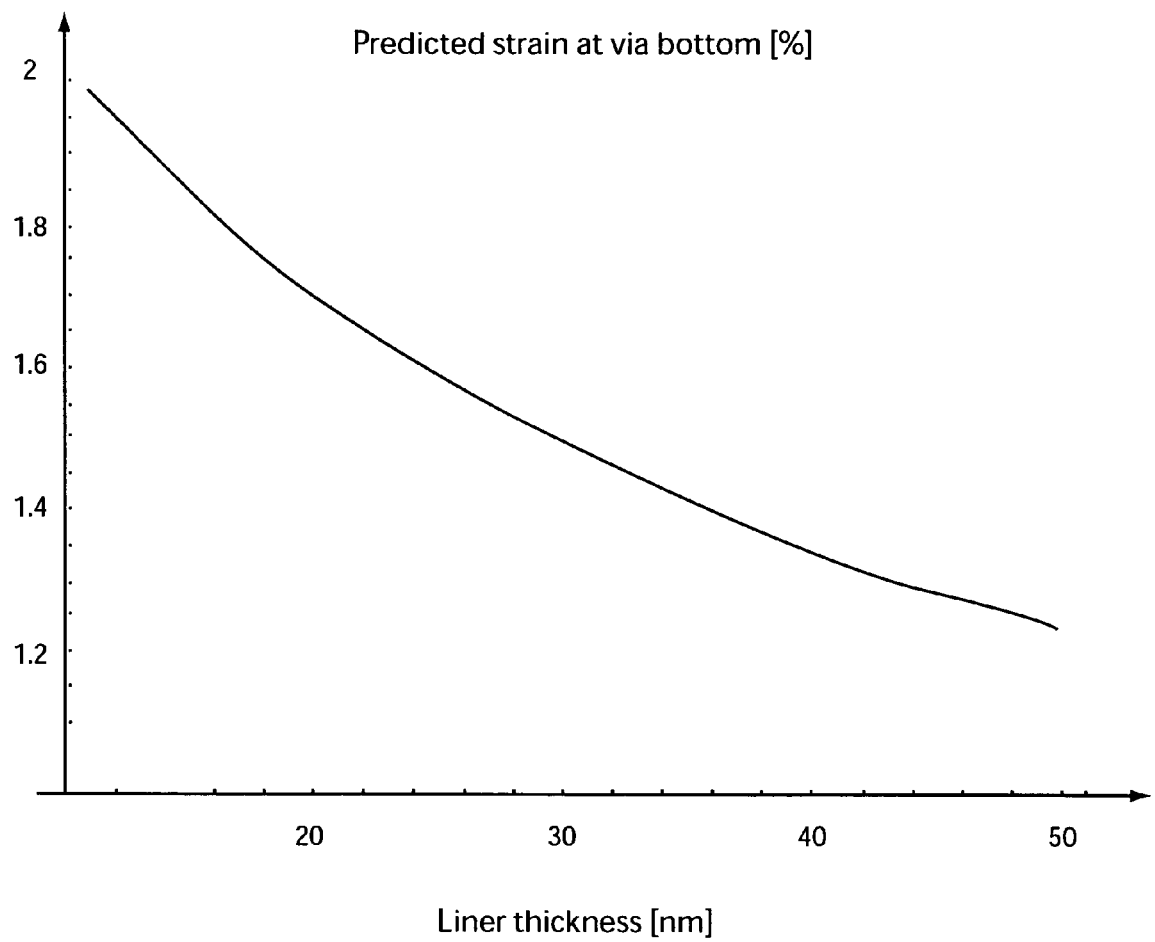
FIG. 4 is a plot of predicted strain at via bottom versus liner thickness for Cu metallization in accordance with the present invention.

Referring to FIG. 4 with continued reference to FIG. 1, a stacked via, composed of CA/M1/V1/V2 levels, is subject to a 100° C. increase in temperature with normal values of via geometry and material properties. The following illustrative values were employed. The M1 width equals about 0.325 μm, and the M2 width equals about 0.435 μm. The CA and V1 vias are tapered such that the diameter at the via bottom is about 0.230 μm and the vertical thickness of CA, M1, V1 and M2 is about 0.320 μm. The following values are illustratively employed for the elastic modulus, E, of the Cu, liner, SiLK™ and SiO$_2$ layers, and for the CTE, α, of the Cu and SiLK™ layers: $E_{Cu}$=130 GPA, $E_{Liner}$=400 GPa, $E_{SiLK}$=3 GPa, $E_{oxide}$=70 GPa, $α_{SiLK}$=66 ppm/° C., $α_{Cu}$=16 ppm/° C.

As the liner thickness decreases from 40 nm to 20 nm, the strain on the Cu in the via bottom increases from approximately 1.4% to 1.7%. This change in strain is large enough to affect the $N_{50}$ lifetimes of the stacked via distribution.

This model can be extended to other material systems (e.g., liner and metallization composition) and geometries (e.g., liner thickness and via geometry) to assess the expected reliability behavior of future test structures.

The predicted strain at the via bottom versus liner thickness for several combinations of materials is illustratively shown in FIGS. 5–8.

Referring to FIGS. 5–8, predicted strain for a stress condition of −65° C. to +150° C. in which either Cu or aluminum (Al) metallization is used is illustratively shown. The results are for a particular stacked via geometry, a given taper in the vias, dielectric thickness and oxide passivation thickness. As such, there are many length scales involved rather than just the radius of the via bottom, so the liner thicknesses applies to a specific configuration.

Figure 5:
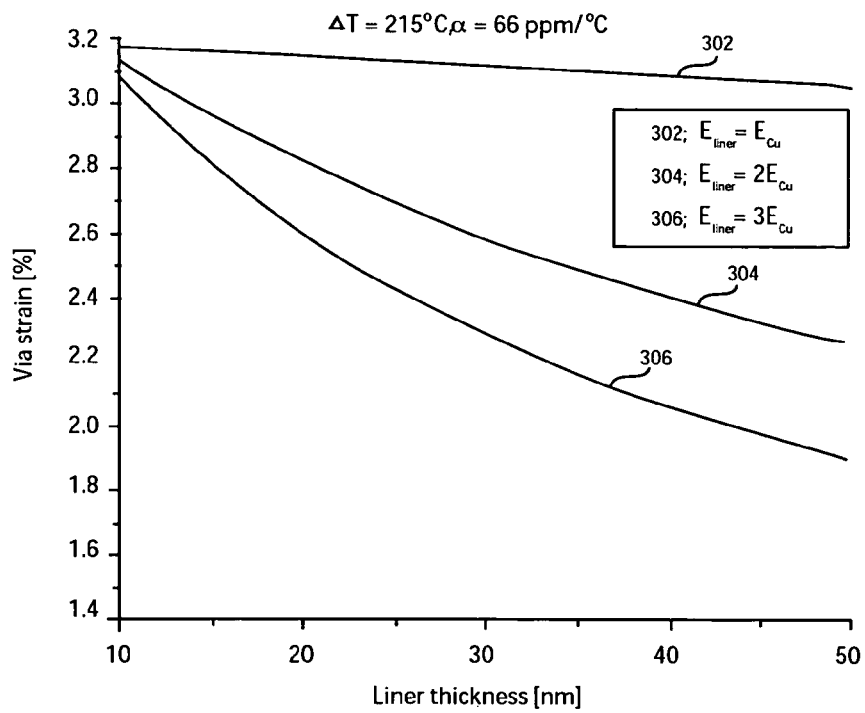
FIG. 5 is a plot of predicted strain at via bottom versus liner thickness for Cu metallization and a high coefficient of thermal expansion (CTE) dielectric showing different elastic properties of the liner in accordance with an embodiment of the present invention.

Referring to FIG. 5, Cu metallization and a high CTE dielectric material, e.g., polyimide or SiLK™ are employed. The results of via strain versus liner thickness are shown for different elastic properties of a liner material. In the present instance, a liner having the same modulus of elasticity ($E_{Cu}$) as Cu is plotted at curve 302. A liner having double the modulus of elasticity (2 $E_{Cu}$) of Cu is plotted at curve 304, a liner having triple the modulus of elasticity (3$E_{Cu}$) of Cu is plotted at curve 306. The temperature difference for thermal cycling was 215° C. with CTE for the dielectric being 66 ppm/° C.

Figure 6:
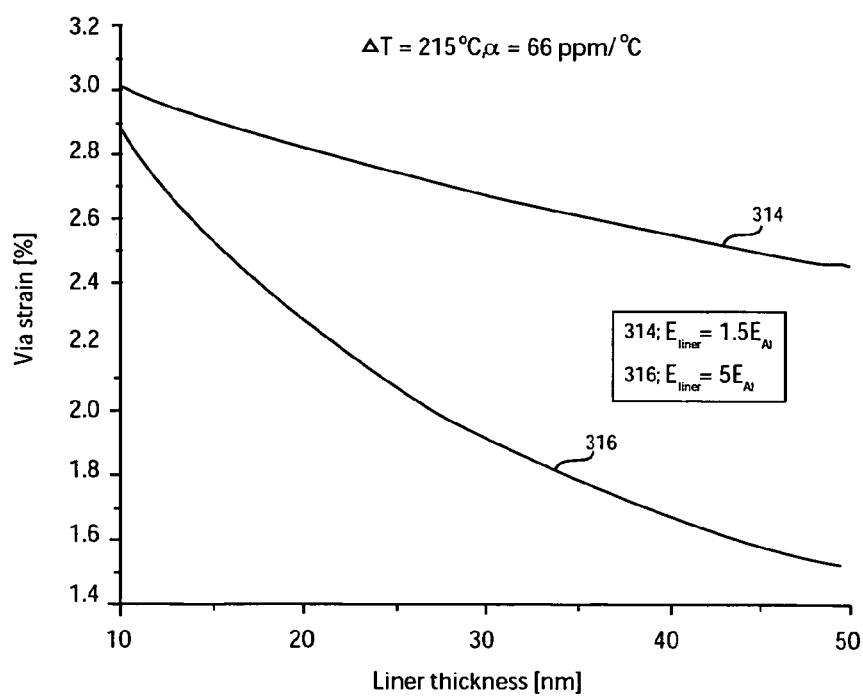
FIG. 6 is a plot of predicted strain at via bottom versus liner thickness for Al metallization and a high CTE dielectric showing different elastic properties of the liner in accordance with an embodiment of the present invention.

Referring to FIG. 6, Al metallization and a high CTE dielectric material are employed. In the present instance, a liner having 1.5 times the modulus of elasticity (1.5 $E_{Al}$) of Al is plotted at curve 314, a liner having 5 times the modulus of elasticity (5$E_{Al}$) of Al is plotted at curve 316. The temperature difference for thermal cycling was 215° C. with CTE for the dielectric being 66 ppm/° C.

Figure 7:
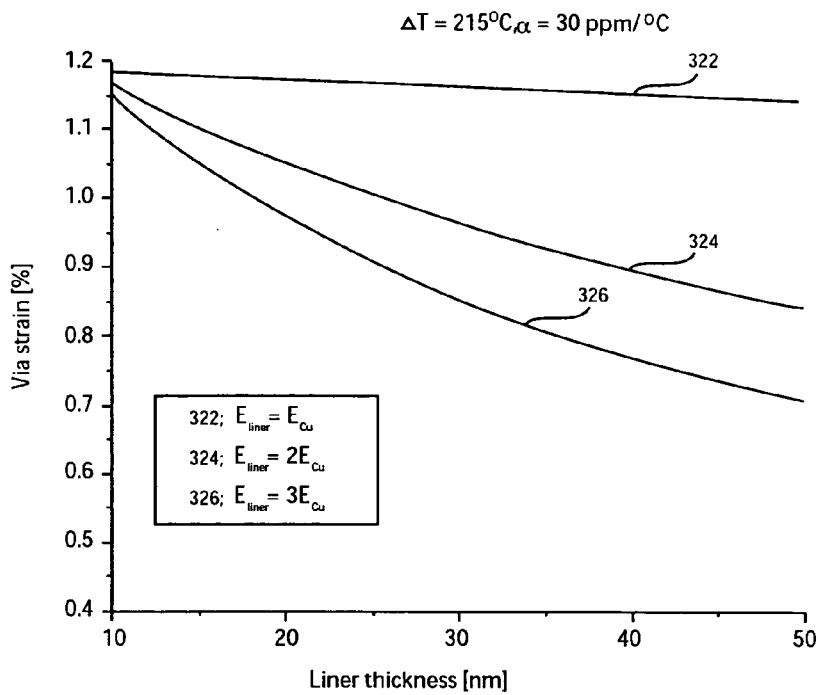
FIG. 7 is a plot of predicted strain at via bottom versus liner thickness for Cu metallization and a medium CTE dielectric showing different elastic properties of the liner in accordance with an embodiment of the present invention.
Figure 8:
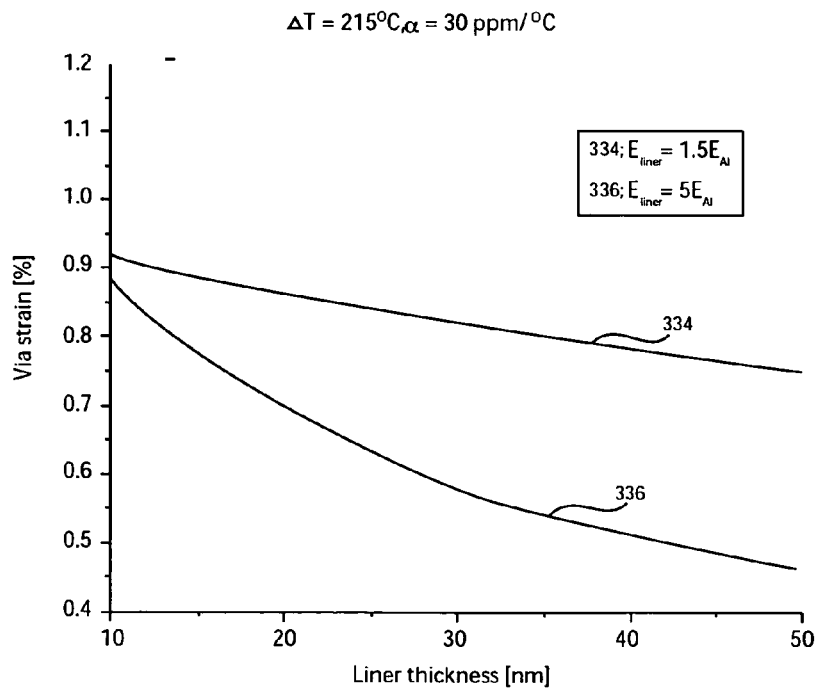
FIG. 8 is a plot of predicted strain at via bottom versus liner thickness for Al metallization and a medium CTE dielectric showing different elastic properties of the liner in accordance with an embodiment of the present invention.

Referring to FIGS. 7 and 8, predicted strain for a stress condition of −65° C. to +150° C. in which either Cu or aluminum (Al) metallization is used is illustratively shown. The results are for a particular stacked via geometry, a given taper in the vias, dielectric thickness and oxide passivation thickness. As such, there are many length scales involved rather than just the radius of the via bottom, so the liner thicknesses apply to a specific configuration. FIG. 7 corresponds to Cu metallization and a moderately high CTE dielectric material, e.g., CTE=30 ppm/° C. The results of via strain versus liner thickness are shown for different elastic properties of a liner material. In the present instance, a liner having the same modulus of elasticity ($E_{Cu}$) as Cu is plotted at curve 322. A liner having double the modulus of elasticity (2 $E_{Cu}$) of Cu is plotted at curve 324, a liner having triple the modulus of elasticity (3$E_{Cu}$) of Cu is plotted at curve 326. The temperature difference for thermal cycling was 215° C. with CTE for the dielectric being 30 ppm/° C.

Referring to FIG. 8, Al metallization and a moderately high CTE dielectric material are employed. In the present instance, a liner having 1.5 times the modulus of elasticity (1.5 $E_{Al}$) of Al is plotted at curve 334, a liner having 5 times the modulus of elasticity (5$E_{Al}$) of Al is plotted at curve 336. The temperature difference for thermal cycling was 215° C. with CTE for the dielectric being 30 ppm/° C.

In the case of a low CTE dielectric material (e.g., between about 10 ppm/° C. and about 20 ppm/° C.) negligible strain is produced. FIGS. 5–8 list the elastic modulus of the liner as a fraction of that of the metallization (Cu or Al). The cases roughly correspond to the liner materials commonly used for Cu or Al metallization. For example, titanium (Ti) is roughly equivalent to that of Cu, Ta is roughly 2 times higher than Cu, W is roughly 3× higher than Cu, Ti is roughly 1.5 times higher than Al and W is roughly 5× higher than Al.

In terms of the stress condition, a threshold liner thickness can be determined above which thermal cycle fails should not occur. For example, the industry standard thermal cycle stress condition is −65° C. to +150° C. This temperature range would correspond to a certain via strain for a given structure and set of materials. Therefore, it is possible to define a threshold via strain that would cause failures if exceeded. In one example, for Cu metallization and a SiLK™ dielectric, where the mismatch in CTE is 50 ppm/° C., the analysis indicates that for a reasonably large sample size of, say, 1000–10000 and a ΔT=215° C., failures should not be observed after 500 cycles if the via strain is below 2.5% and after 1000 cycles if the via strain is below 2.3%.

The threshold liner thickness for a Ta-based liner would be about 35 nm for 500 cycles and about 45 nm for 1000 cycles under these conditions. Likewise, if the liner is composed of Ti, the threshold liner thicknesses are slightly larger than these values. If the liner is composed of W, the critical liner thickness would be about 22 nm for 500 cycles and about 28 nm for 1000 cycles. Note that if the CTE of the dielectric is less than 50 ppm/° C., all of the liner materials would not produce fails due to the lower thermal strain.

Once determined for a given design, this information may be employed as a reliability measure for chips produced by a given process to provide a given structure. Based on the data gathered, liner thickness can be used to monitor, in place, the thermal cycle reliability of chips during the manufacturing process. This includes measuring the liner thickness from cross sections of a simple kerf structure during the manufacture of the BEOL structure of the chip. Data such as that shown in FIG. 3 would have already been generated for the process by using standard thermal cycle tests.

Similarly, results such as those shown in FIG. 4 can be generated by modeling the mechanical response of various stacked via designs. The liner thickness of the structure could then be used as a direct indicator of thermal cycle performance expected from the process.

Although the results discussed previously apply to Cu metallization and a SiLK™ dielectric, the same methods can be applied to other combinations of materials. For example, Al metallization can be used instead of Cu and polyimide can be used instead of SiLK™. The present invention is particularly useful when a mismatch in CTE exists between the metallization and surrounding insulator and that the liner material has a higher modulus compared to the metal. However, the concepts and scope of the above disclosure can be applied to other structures, materials and applications.

Figure 9:
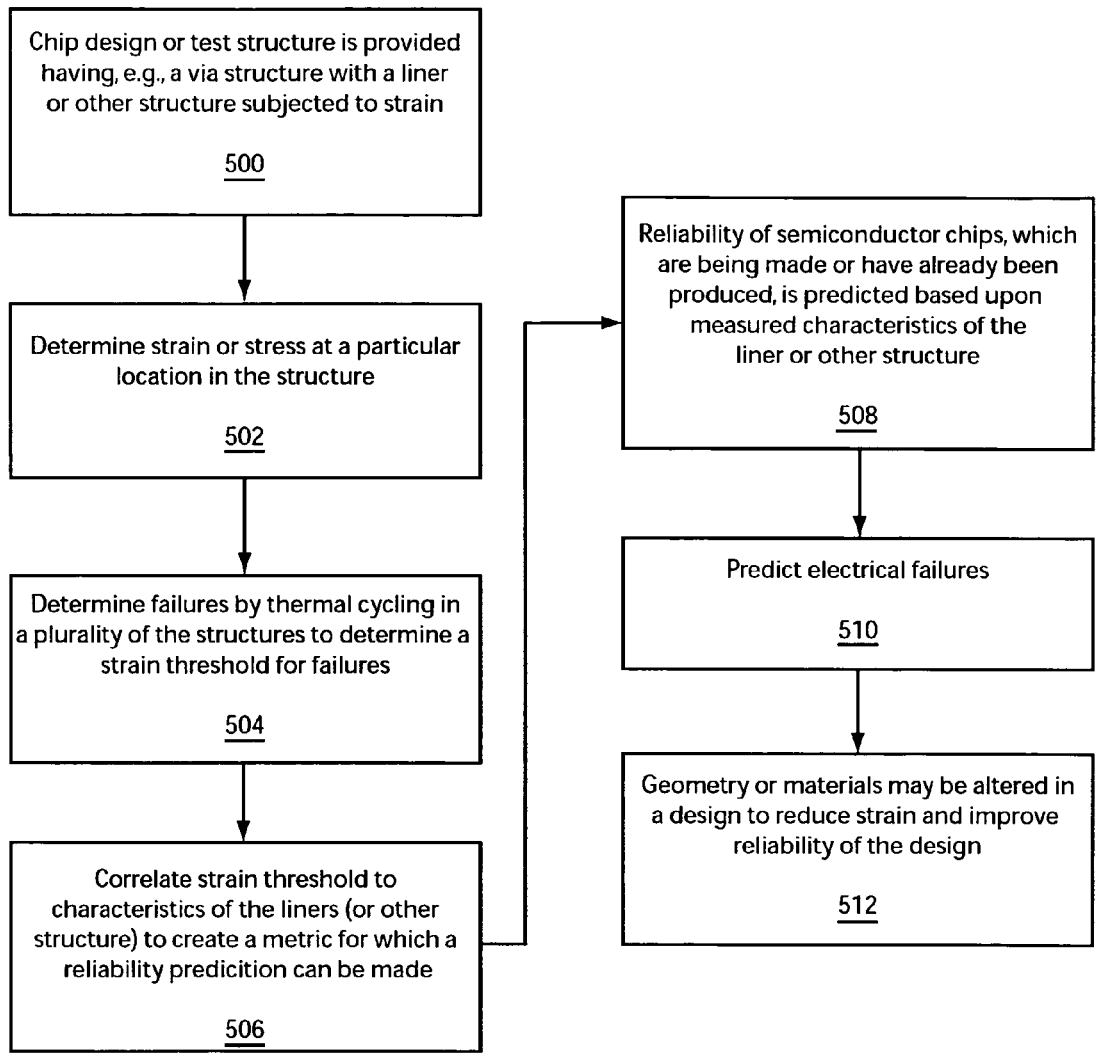
FIG. 9 is a block/flow diagram showing steps for predicting reliability based on feature characteristics of a device in accordance with the present invention.

It should be understood that the elements shown in FIG. 9 may be implemented in various forms of hardware, software or combinations thereof. Preferably, these elements are implemented in software on one or more appropriately programmed general-purpose digital computers having a processor and memory and input/output interfaces.

Referring to FIG. 9, a block/flow diagram showing a system/method for evaluating reliability of a semiconductor chip or chip design is illustratively shown. In block 500, a semiconductor chip design or test structure is provided having a structure, such as a via structure formed therein. The via structure may include a liner at an interface between metal structures and dielectric material or other structure subjected to strain may be employed and benefit from the present invention.

In block 502, strain (or stress) is determined at a particular location, for example, at or adjacent to the liner. This strain should be determined by calculation, estimate, or measurement. In block 504, failures may be induced by thermal cycling in a plurality of the metal (via) structures to determine a strain threshold for failures for the design. The strain threshold is such that below the threshold no failures occur in the metal structures.

In block 506, this strain threshold is correlated to characteristics of the liner (or other structure) to create a metric for which reliability can be determined. This may be performed by maintaining statistics on failures and non-failures during the thermal cycling tests on the test structure(s).

In block 508, reliability of semiconductor chips, which are being made or have already been produced, is predicted based upon measured characteristics of the liner or other structure. Based on initial data, the correlation between, say liner thickness and reliability is made. Therefore, after a chip is manufactured, a sample may have the liner thickness measured to provide a measure of the reliability of that sample to predict electrical or other failures, in block 510. Since a liner may be formed by a uniform deposition process, the liner may be measured at any convenient location of the chip or off the chip (e.g., in the kerf region). In this way, the liner measurement can be made at any time during the manufacturing process and be employed to reject chips prior to their completion. The liner measurement may be made by cross-sectioning and microscope measurement, although other measurement methods may be employed.

In block 512, geometry or materials may be altered in a design to reduce strain and improve reliability of the design. For example, a thickness of a liner may be increased or decreased or its material changed to affect the strain. The greatest benefits of the present invention are realized for mismatches between the metal structure and the dielectric, which are greater than about 30 ppm/° C.

The present invention provides a metallization structure that is less susceptible to thermal cycle failure and includes a metal patterned preferably using a Dual Damascene process with conductive liners along the bottoms and sidewalls of the vias. A dielectric material surrounds the metal, where the mismatch in the coefficient of thermal expansion (CTE) between the metallization and surrounding insulator is present along with the liner thickness such that no failures are expected during a standard −65° C. to +150° C. thermal cycle stress condition.

Some example structures include the following characteristics. One structure may include copper (Cu) as the metal, the liner material may include tantalum (Ta) or tantalum nitride (TaN). The liner thickness for these materials may be in the range of between about 25 nm and about 35 nm, and the CTE of the insulator is in the range of between about 50 ppm/° C. and about 75 ppm/° C. The tantalum (Ta) or tantalum nitride (TaN) liner material may include a thickness in the range of between about 35 nm and about 45 nm, and the CTE of the insulator is in the range of between about 75 ppm/° C. and about 100 ppm/° C.

In another embodiment, the metal may include copper (Cu), the liner material may include titanium (Ti) or titanium nitride (TiN). The liner thickness may be in the range of between about 25 nm and about 35 nm, and the CTE of the insulator is in the range of between 50 ppm/° C.–75 ppm/° C. In another embodiment, the metal includes copper (Cu), the liner material includes titanium (Ti) or titanium nitride (TiN), the liner thickness is in the range of between about 35 nm and about 55 nm, and the CTE of the insulator is in the range of between about 75 ppm/° C. and about 100 ppm/° C. In another embodiment, the metal is copper (Cu), the liner material is tungsten (W), the liner thickness is in the range of between about 10 nm and about 20 nm, and the CTE of the insulator is in the range of between about 50 ppm/° C. and about 75 ppm/° C. In still another embodiment, the metal includes copper (Cu), the liner material includes tungsten (W), the liner thickness is in the range of between about 20 nm and about 30 nm, and the CTE of the insulator is in the range of between about 75 ppm/° C. and about 100 ppm/° C.

In other embodiments, the metal includes aluminum (Al), the liner material includes titanium (Ti) or titanium nitride (TiN), the liner thickness is in the range of between about 25 nm and about 35 nm, and the CTE of the insulator is in the range of between about 50 ppm/° C. and about 75 ppm/° C. Further, when the metal includes aluminum (Al), the liner material includes titanium (Ti) or titanium nitride (TiN), the liner thickness is in the range of between about 35 nm and about 55 nm, and the CTE of the insulator is in the range of between about 75 ppm/° C. and about 100 ppm/° C. When the metal includes aluminum (Al), the liner material includes tungsten (W), the liner thickness is in the range of between about 10 nm and about 20 nm, and the CTE of the insulator is in the range of about 50 ppm/° C. an about 75 ppm/° C. When the metal is aluminum (Al), the liner material includes tungsten (W), the liner thickness is in the range of between about 20 nm and about 30 nm, and the CTE of the insulator is in the range of between about 75 ppm/° C. and about 100 ppm/° C.

Having described preferred embodiments for control of liner thickness for improving thermal cycle reliability (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for evaluating reliability of a semiconductor chip, comprising the steps of:
   determining strain at a location in structure including determining strain at the bottom of a via in contact with a liner in the via;
   evaluating failures in a plurality of the structures after stress cycling to determine a strain threshold with respect to a feature characteristic; and
   evaluating structures on a chip based on the feature characteristic to predict reliability based on the strain threshold and the feature characteristic.

2. The method as recited in claim 1, wherein the feature characteristic includes a liner thickness formed in via holes and the step of evaluating structures on a chip based on the feature characteristic to predict reliability includes measuring a thickness of a liner to predict electrical failures.

3. The method as recited in claim 1, wherein the step of evaluating failures in a plurality of the structures includes the step of thermal cycling the plurality of structures.

4. The method as recited in claim 1, wherein the step of evaluating failures in a plurality of the structures includes the step of determining the strain threshold such that below the threshold no failures occur in the structures.

5. The method as recited in claim 1, wherein the strain is generated by thermal mismatch and the method further comprises the step of altering geometry of the feature characteristic to reduce strain.

6. The method as recited in claim 5, wherein the step of altering includes altering a thickness of a via liner.

7. The method as recited in claim 1, wherein the strain is generated by thermal mismatch and the method further comprises the step of altering material selection of the feature characteristic to reduce strain.

8. The method as recited in claim 7, wherein the thermal mismatch is greater than 30 ppm/° C. between the feature characteristic and its surroundings.

9. A method for evaluating reliability of a semiconductor chip, comprising the steps of:
providing a semiconductor chip design having a metal structure therein, the metal structure being in contact with dielectric material;
determining strain at a location at or adjacent to the metal structure due to thermal stress;
evaluating failures in a plurality of the metal structures to determine a strain threshold for failures;
correlating the strain threshold to characteristics of the metal structure, wherein the characteristics of the metal structure include a liner thickness formed in via holes; and
predicting reliability of semiconductor chips based upon measured characteristics of the metal structure including measuring a thickness of a liner to predict electrical failures.

10. The method as recited in claim 9, wherein the step of evaluating failures includes the step of thermal cycling the plurality of metal structures.

11. The method as recited in claim 9, wherein the step of evaluating failures includes the step of determining the strain threshold such that below the threshold no failures occur in the structures.

12. The method as recited in claim 9, wherein the strain is generated by thermal mismatch and the method further comprises the step of altering geometry or material selection of the metal structures to reduce strain.

13. The method as recited in claim 12, wherein the mismatch between the metal structure and the dielectric is greater than 30 ppm/° C.

* * * * *